United States Patent [19]

Pommerrenig

[11] 4,237,471

[45] Dec. 2, 1980

[54] METHOD OF PRODUCING A SEMICONDUCTOR PHOTODIODE OF INDIUM ANTIMONIDE AND DEVICE THEREOF

[75] Inventor: Dieter H. Pommerrenig, Burke, Va.

[73] Assignees: Hamamatsu Corporation, Middlesex, N.J.; Hamamatsu TV Co, Ltd., Hamamatsu, Japan

[21] Appl. No.: 51,245

[22] Filed: Jun. 22, 1979

Related U.S. Application Data

[60] Continuation of Ser. No. 879,640, Feb. 21, 1978, abandoned, which is a division of Ser. No. 739,659, Nov. 8, 1976, abandoned.

[51] Int. Cl.² .............................................. H01L 27/14
[52] U.S. Cl. ........................................ 357/30; 357/16; 357/61

[58] Field of Search ......................... 357/30, 16, 61, 63

[56] References Cited

U.S. PATENT DOCUMENTS 3,558,373  1/1971  Moody ................................. 148/171

Primary Examiner—Martin H. Edlow
Attorney, Agent, or Firm—Moonray Kojima

[57] ABSTRACT

A method of producing semiconductor photodiodes of indium antimonide, by growing an indium antimonide epitaxial layer of one type conductivity onto a substrate of indium antimonide of another type conductivity, utilizing conventional vapor phase or liquid phase epitaxial techniques, wherein the antimony in the epitaxial layer is partially replaced by either arsenic or phosphorus, thus resulting in a high performing photoelectric device.

6 Claims, 16 Drawing Figures

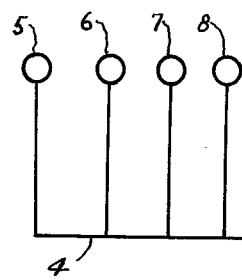
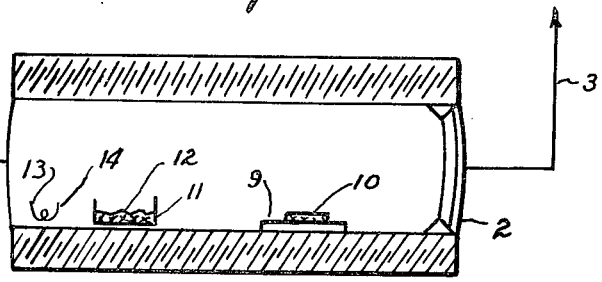
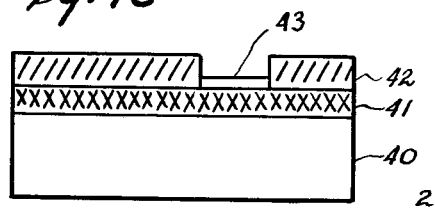
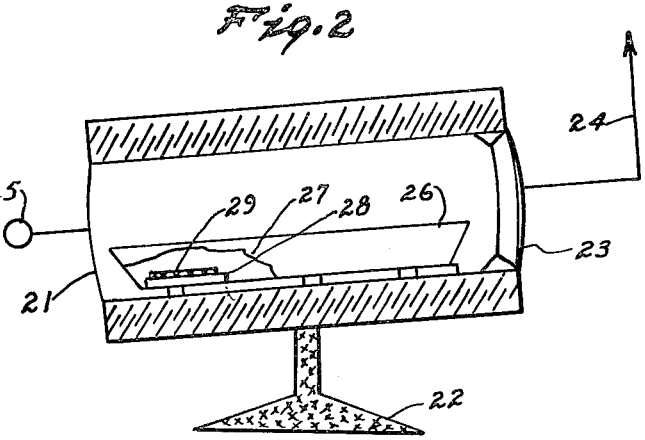
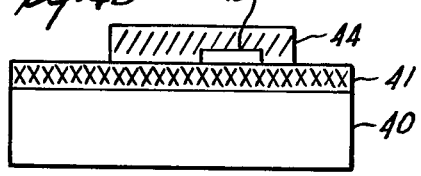
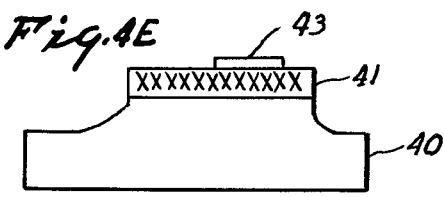
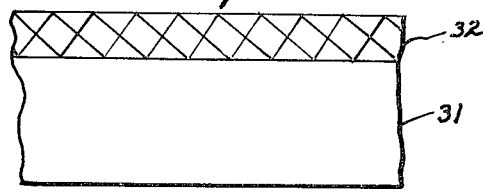
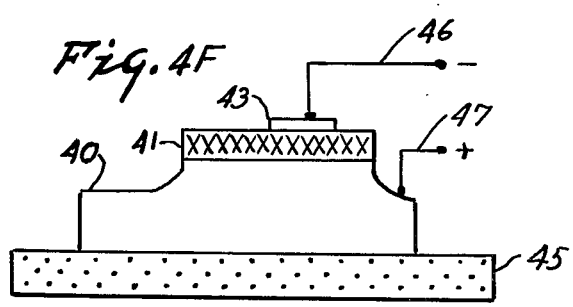
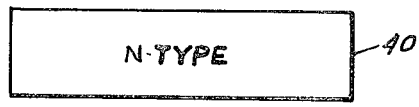
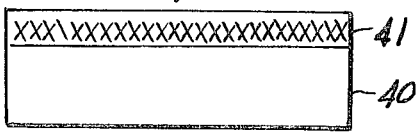

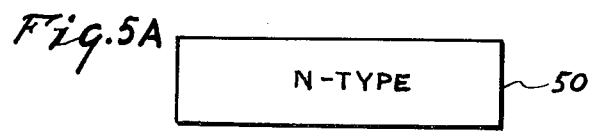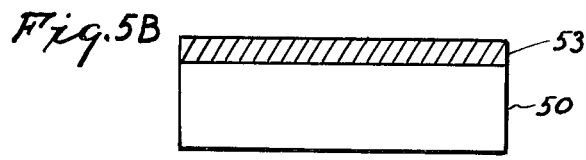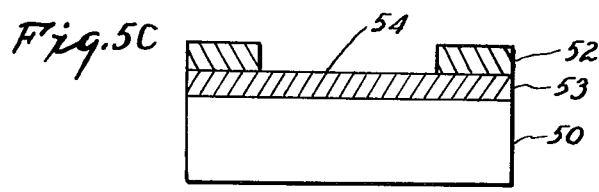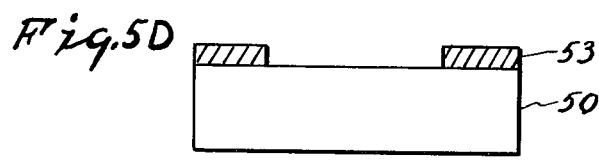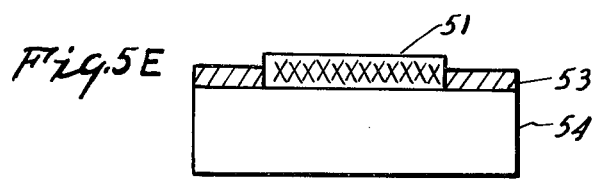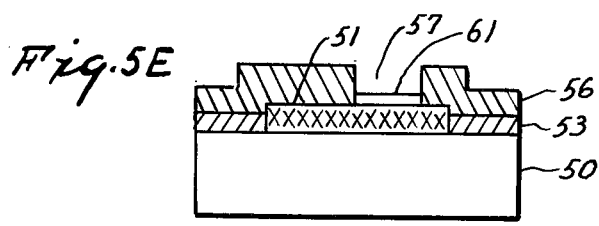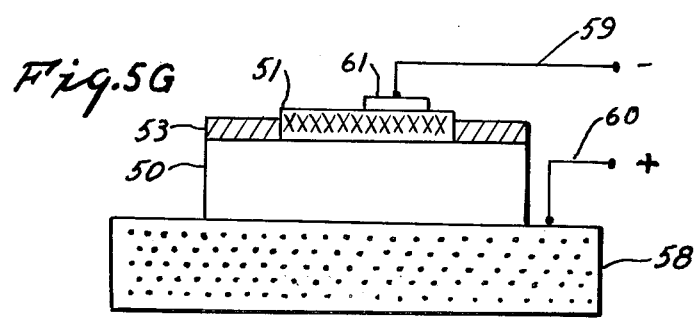

METHOD OF PRODUCING A SEMICONDUCTOR PHOTODIODE OF INDIUM ANTIMONIDE AND DEVICE THEREOF

This is a continuation of application Ser. No. 879,640 Feb. 21, 1978, which is itself a division of Ser. No. 739,659 filed Nov. 8, 1976, both of which are abandoned.

BACKGROUND OF THE INVENTION

This invention relates to a method of producing semiconductor photodiodes having an indium antimonide epitaxial layer of one type conductivity onto an indium antimonide substrate of another type conductivity, and more particularly to such a method wherein the antimony in the epitaxial layer is partially replaced by another element.

Epitaxial growth is a process of growing solid material from a suitable environment onto a substrate. The growth is epitaxial when the material grown forms an extension of the crystal structure of the substrate. By the addition of gases comprising donor or acceptor type impurities, the epitaxially deposited layer may be of n-type or p-type conductivity as desired.

It is commonly known that diffusion processes are used to produce the p-type region of pn-InSb photovoltaic detectors. Uniformly n-type doped indium antimonide crystals are enclosed together with p-type dopants such as cadmium or zinc in a sealed quartz ampoule. The diffusion will take place at 450°-500° C. After removal of the diffused substrate, the material is further processed into single or multi-element semiconductor photodiodes by utilizing standard planar or mesh technologies.

These methods require costly and complicated etching and optimization processes which greatly aggravate the establishment of reproducible, thin p-layer regions and fail completely when extremely thin, uniform thicknesses are required. Therefore, the resulting photoelectric devices suffer in their performance characteristics. Still another method being utilized is the growth of an epitaxial layer of indium antimonide having the opposite conductance type on an indium antimonide monocrystal. This method suffers greatly from the nonstoichiometric transport properties of both species, the indium and antimony, which will result in an epitaxial layer of very low quality.

It was, therefore, necessary to find a method of producing indium antimonide single and multi-element detectors according to the epitaxial growth method, which does not have the deficiency of the conventional epitaxial methods.

The main demands placed upon the epitaxial process are restoration of the stoichiometry of the epitaxial layer, to assure equivalent and a sufficient partial pressure of all gas species involved and to apply standard device processing technologies to the production of photoelectric indium antimonide diodes. These requirements can be fullfilled by executing the epitaxial process in an apparatus having the capability of producing epitaxial layers of the desired composition.

SUMMARY OF THE INVENTION

Accordingly, an object of the invention is to eliminate the above and other deficiencies of the prior art.

These and other objects are attained in the invention which encompasses a method and devices produced thereby, and wherein an indium antimonide epitaxial layer of one type conductivity is epitaxially grown onto an indium antimonide substrate of another type conductivity, with the antimony in the epitaxial layer partially replaced with arsenic or phosphorus. Photodiodes and other devices are then fabricated therefrom. Preferred epitaxial layers may encompass $InAs_xSb_{1-x}$, wherein x is from 0.01 to 0.50, preferably within the range of 0.01 to 0.05, and most preferably 0.05. The same ratios hold for phosphorus.

A feature of the invention is a method wherein there is partial substitution of antimony with arsenic or phosphorus in the indium antimonide epitaxial layer.

A further feature of the invention is the use of an epitaxial layer of $InAs_xSb_{1-x}$, wherein x is from 0.01 to 0.50, preferably 0.01 to 0.05, and most preferably 0.05.

BRIEF DESCRIPTION OF THE DRAWING

FIG. 1 depicts an illustrative apparatus to practice the invention wherein vapor phase epitaxial depositing is accomplished.

FIG. 2 depicts an illustrative apparatus to practice the invention wherein liquid phase epitaxial depositing is accomplished.

FIG. 3 depicts an illustrative substrate having an epitaxial layer grown thereon, with the epitaxial layer having partial substitution of arsenic or phosphorus for antimony in the indium antimonide.

FIGS. 4A—4F depict the step by step production of a mesa configuration photocondutive device employing the inventive method and FIGS. 5A—5G depict step by step production of a planar configuration photoconductive device employing the inventive method.

DETAILED DESCRIPTION OF PREFERRED EMBODIMENTS

FIG. 1 depicts a typical epitaxial gas or vapor phase reactor apparatus for growing epitaxial layers on a substrate, comprising a furnace chamber 1, having a temperature and heating control system not shown, a removable cap 2, gas inlet 4 and gas exhaust 3. Through inlet 4 may be supplied different gases for the deposition of or growth of a suitable layer. Within the chamber 1 may be placed crystal dish 9 on which a substrate 10, such as of indium antimonide may be placed. Also in chamber 1 there may be placed another dish 11 on which may be placed solid indium 12, and another dish 13, on which may be placed, for example, a dopant 14 such as zinc or cadium for p-type doping and tin or tellurium for n-type doping. From sources 5, 6, 7 and 8, there is supplied for example, reagent gases $H_2$, HCl, $AsH_3$, or $PH_3$, and $SbH_3$, respectively, with suitable flow control with known type of metering.

In operation of FIG. 1, the dish 9 having indium antimonide slice 10, such as of n-type conductivity, thereon is charged through the right end having cap 2 removed therefrom, and into the chamber 1. Also, the containers 11 and 13 having loaded thereon solid indium and zinc dopant, respectively, are also charged into the chamber 1, through the open right end. Then cap 2 is used to close chamber 1. Chamber 1 is then purged by supplying hydrogen gas from source 6 through inlet 4. The chamber is then raised in temperature to a range of about 480° C. to 520° C. The temperature of the indium is raised to about 700° C. and that of zinc 14 is raised to about 380° C. As the temperature of the reaction chamber approaches a constant value, the epitaxial growth atmosphere is established in chamber 1 by supplying for example, antimony hydride as an antimony source from source 5 and arsine as an arsenic source from source 8, and hydrogen chloride as a transport agent for both the indium and zinc, from source 7. The gases are supplied through the single common inlet 4, or through a plurality of individual inlets. The hydrogen is continuously supplied, serving as a carrier and reducing gas. Zinc is utilized to provide p-type doping while the epitaxial layer is being grown. Of course, cadmium can also be used to provide p-type doping. If n-type doping is desired tin or tellurium may be used.

By suitably adjusting the molecular ratio of stibine and arsine, the compositional ratio of epitaxial film can be altered. The mixed crystal $InAs_xSb_{1-x}$ should have the ratio wherein x is between 0.01 to 0.50, and preferably toward the lower range of 0.01 to 0.05, and most preferably wherein x"0.05. The same ratios are applicable for use of phosphorus in place of arsenic. In the gas phase operation, this can be done by suitable adjustment of the flow rates of the reagent gases using conventional metering systems. For example, using a 36 inches long, 2 inches inner diameter reactor, flow rates as follows will produce $InAs_{0.05}Sb_{0.95}$ $H_2=500$ to 1,000 cc/min.; $SbH_3=10$ to 25 cc/min; $AsH_3=50$ to 100 cc/min and $HCl=3$ to 6 cc/min.

When a sufficient period of time has elasped, such as for example 30 to 60 minutes, for the growth of p-type indium antimonide (using zinc for the dopant) epitaxial layer, to the desired thickness, such as 0.4 microns, the reagent gases are turned off. After sufficient time for purging of the atmosphere in the chamber 1, such as about 30 minutes, the furnace is turned off and left to cool down to room temperature. The dish 9 is then removed from the chamber 1 and the chip is then ready for further fabrication, such as placement of ohmic contacts, which may be of gold of 2,000 to 5,000 Å, and etching and shaping of the chips.

In FIG. 2, there is depicted a liquid phase epitaxial reactor comprising a furnace chamber 21, which is supported by support 22 to be tiltable for example up to 30° in either direction from the horizontal, an inlet 25 for supplying hydrogen gas, and an outlet 24 for exhausting the atmosphere, and a removable end cap 23 for sealing the chamber 21. Within the reactor there may be placed a boat 26 having therein a slice 29 for example of indium antimonide on a support 28, and a mixture 27 of for example indium, antimony, and arsenic in desired compositional proportions and a dopant such as zinc for p-type conductivity. The slice 29 may already be of an n-type material, as was the case in the FIG. 1 slice 10. The arsenic may be replaced with phosphorus. Initially, an indium antimonide slice 29 is placed on one end of boat 26 in such a manner as to not be in contact with the metallurgical mixture 27 which is placed at the opposite end of the boat 26. The boat 26 containing the slice 29 on support 28 and mixture 27 may be charged through the right end of chamber 21, and thereafter capped with removable cap 23.

In the operation of the apparatus of FIG. 2, the boat 26 which may be of quartz is first loaded with the metallurgical mixture 27 at one end and the support 28 having an indium antimonide slice 29 at the other end. Then boat 26 is placed in chamber 21. Then, cap 23 is closed. Then, hydrogen gas is supplied, such as at a flow rate of 500 to 1,000 cc/min. in a 2" cyclindrical inner diameter chamber 20" long, through inlet 25 to purge the chamber. After sufficient purging, which may be about 30 minutes, heat is applied to chamber 21 and raised to a temperature of about 500 °C. This temperature will produce a uniform melt of the mixture 27 without affecting the characteristics of the indium antimonide monocrystal 29. As the temperature of the chamber reaches equilibrium which is about 20 minutes, the chamber 21 is tilted in such a way that the liquid melt 27 will roll over slice 29 in a complete manner, such as shown in FIG. 2. After a suitable time, such as five minutes, has elapsed, the temperature of chamber 21 is sequentially lowered in small increments, in order to shift the thermodynamic equilibrium of the melt to solid state, thus resulting in the growth of the epitaxial layer. The thickness of the epitaxial layer is a function of the length of the intervals and composition of the melt. After the desired layer thickness has been attained, such as 0.4 micron, the chamber 21 is purged, the heat turned off and the chamber is cooled to room temperature. The boat 26 is then removed from chamber 21.

FIG. 3 shows a typical device wherein onto substrate 31, for example of indium antimonide, is epitaxially grown, an epitaxial layer 32, wherein the antimony has been partially substituted with arsenic or phosphorus, in the ratio of $InAs_xSb_{1-x}$, wherein x is 0.01 to 0.50, preferably 0.01 to 0.05 and most preferably 0.05. The same holds for phosphorus. The foregoing apparatuses of FIGS. and 2 may be used to produce such epitaxial growth with appropriate doping.

FIGS. 4A—4F show a photoconductive device using a mesa type configuration. Either of the above apparatus may be used to obtain this device together with ordinary photolithographic and fabrication techniques. First a slice of indium antimonide of n-type conductivity is used as a substrate 40. Onto this substrate 40 is epitaxially grown an indium antimonide epitaxial layer 41 (See FIG. 4B) having the antimony partially substituted with either arsenic or phosphorus in amounts to satisfy that above compositional ratios, and doped, for example, with p-type conductivity. Next, a photoresist 42 is placed on the epitaxial layer 41 and subsequently stripped to provide a window, and in the window a gold ohmic contact 43 is deposited or placed. The ohmic contact is about 2,000 to 5,000 Å in thickness. The photoresist may be, for example, "Shipley Photoresist AZ 1350" and the stripper may be a "Shipley Stripper", both of which are readily available on the commercial market. The results are shown in FIG. 4C. Then, the photoresist 42 is stripped again, and another photoresist 44 is placed over both the epitaxial layer 41 and the gold contact 43 as shown in FIG. 4D. Then as depicted in FIG. 4E, the epitaxial layer 41 and the substrate 40 are both etched away, resulting in a mesa type arrangement. The photoresist 44 is removed, and as shown in FIGS. 4F, leads are placed on the contact 43, and on the substrate 40. The substrate is mounted on a metallic plate 45, such as by use of epoxy.

In FIGS. 5A—5G, there are depicted a photodetecting device produced in accordance with the method of this invention using a planar configuration. In FIGS. 5A and 5B, an indium antimonide substrate 50 of n-type conductivity has deposited thereon silicon dioxide layer 53. The silicon dioxide precipitation on the crystal surface 50 is preferably effected through pyrolysis of organosilicon compounds, such as silicon chloroform, at a temperature of approximately 400°—500° C. The carrier, concentration of the substrate 50, as in the substrate of FIG. 4A—4F, may be in the order of $10^{15}$ to $10^{16}$ atoms/$cm^3$. Then, as shown in FIG. 5C, a photoresist 52 is placed on the silicon dioxide layer 53 to form a window 54 as shown. Then, the oxide layer 53 is etched away in that window area 54 to leave as shown in FIG. 5D, the surface of substrate 50 exposed. The etching may be done by using buffered hydrofluoric acid on the exposed area, such as the window 54, to remove the oxide layer. The photoresist is stripped away, and the oxide layer 53 is left remaining. Then, the substrate 50 and oxide layer 53 are placed in either the apparatus of FIGS. 1 or 2, and the epitaxial layer 51 having the antimony of the indium antimonide partially replaced by arsenic or phosphous in accordance with the ratio as discussed above, is grown onto substrate 50. This is shown in FIG. 5E. Then, in FIG. 5F, a photoresist layer 56 with a window 57 is placed on the oxide layer 53 and epitaxial layer 51, as shown. Into the window 57, a gold ohmic contact 61 is deposited in contact with the epitaxial layer 51. Next, the substrate is placed securely on a metallic plate 58, such as by means of an epoxy. Then, as shown in FIG. 5G, the photoresist 56 is removed, and the electrode lead 59 is placed on ohmic contact 61 and electrode lead 60 is placed on metallic plate 58.

The diodes formed using planar or mosa techniques, can then be used, for example, in infrared detectors of various types, either as single devices or together in groups of two or more in a multi-array arrangement.

Actual examples of the method are as follows.

EXAMPLE 1.

Using a vapor phase epitaxial deposition reactor, such as shown in FIG. 1, an epitaxial layer of indium antimonide having the antimony partially replaced with arsenic was grown onto an indium antimonide substrate. The substrate was n-type conductivity and the epitaxial layer was p-type. The cylindrical reactor of FIG. 1, was about 36 inches long, with an inside diameter of about 2 inches and thickness of about 4 inches. The reagent gases used with the following source pressures, were as follows: From source 6, $H_2$ at 20.0 p.s.i., with a variance of ±3 or 4 p.s.i., from source 5, $SbH_3$ at 14.3 p.s.i., with a variance of a range of 10 to 15 p.s.i.; from source 8, $AsH_3$ at 14.3 p.s.i. with a variable range of 10 to 15 p.s.i., and from source 7, HCl at 14.3 p.s.i. with a variable range of 10 to 15 p.s.i. Into a crystal dish 9, was placed a slice 10 of indium antimonide having n-type conductivity; the slice was about 3 cm$^2$, and had a thickness of about 8 mils. Also, placed in the container 11 was about 5 grams of solid indium 12 of high purity, such as over 99.9999 percent. In container 13 was placed a pellet 14 of about 2 milligrams of zinc for providing p-type doping to the epitaxial layer. The chamber 1 was then closed with cap 2, and flushed for about 30 minutes with a stream of hydrogen. The chamber 1 was raised in temperature of about 480° C. The flow rates of hydrogen was 500 cc/min. The flow rates of $AsH_3$ was 80 cc/min; the flow rate of $SbH_3$ was 20 cc/min; and the flow rate of HCl was 5 cc/min. The time of exposure of the reagent gases to the substrate at the heated temperature was about 30 minutes. This produced a thickness of epitaxial layer of about 0.4 microns. The layer was of $InAs_{0.05}Sb_{0.95}$. The chamber was then cooled to room temperature and the substrate 10 having the grown epitaxial layer was removed. Then, as shown in FIGS. 4 and 5, devices were fabricated therefrom.

EXAMPLE 2.

Example 1 was repeated except $PH_3$ at a pressure of 14.3 p.s.i. and a variable range of 10 to 15 p.s.i. at the source 5, and a flow rate of 60 cc/min, was used. similar results as in Example 1 were obtained.

EXAMPLE 3.

A photodetecting device was produced using the apparatus of FIG. 2, namely, a liquid phase epitaxial growth apparatus. The cyclindrical chamber 21 was about 18 inches long, 2 inches inner diameter, and 4 inches thick. Hydrogen at a pressure of 20 p.s.i. with a variable range of ±3 or 4 p.s.i. at the source 25 was supplied to purge the chamber at a flow rate of 500 cc/min. The metallurgical mixture 27 was comprised of 4.5 grams of indium, 4.5 grams of antimony, and 1.0 grams of arsonic, and 1 milligram of zinc pellets. The substrate was indium antimonide slice 29 of 3 cm$^2$ and 8 mils thickness and n-type conductivity. After purging with hydrogen gas from source 25, the furnace 21 was heated to about 500° C. The mixture was disposed on the right side of boat 26. After about 20 minutes, the mixture melted. After about 5 minutes the melt was mixed, and chamber 21 was tilted to cause the mixture melt 27 to completely cover slice 29. After about 10 minutes, an epitaxial layer was grown on the substrate 29. The chamber 21 was purged, the temperature cooled to room temperature, and the boat 26 was removed. The slice 29 having an epitaxial layer was removed. The epitaxial layer was about 0.4 microns, and contained $InAs_{0.05}Sb_{0.95}$. The diode was then made into devices, such as by planar or mesa techniques.

EXAMPLE 4.

Example 3 was repeated except that phosphorus of 1.0 grams was used in place of arsenic. The results were similar.

In the foregoing examples, also, the p-type dopant could have been cadmium, and the n-type dopant tellurium or tin.

The foregoing description is illustrative of the principles of this invention. Numerous variations and modifications thereof would be apparent to the worker skilled in the art. All such variations and modifications are to be considered to be within the spirit and scope of this invention.

What is claimed is:

1. An infrared photodiode, comprising
   a substrate of indium antimonide of one type of conductivity;
   an epitaxial layer on said substrate of another type conductivity and of indium antimonide having the antimony partially replaced with arsenic or phosphorus and having the general formula $InM_xSb_{i-x}$ wherein M is arsenic or phosphorus, and "x" is between 0.01 to 0.05; and wherein said epitaxial layer forms the detecting surface for the detection of infrared radiation;
   an ohmic contact on said epitaxial layer; and
   an electrode connected directly or indirectly to said substrate.

2. The device of claim 1, wherein said substrate is of n-type conductivity and said epitaxial layer is of p-type conductivity.

3. The device of claim 1, wherein x is 0.05.

4. The device of claim 1, wherein said photodiode is of planar configuration.

5. The device of claim 1, wherein said photodiode is of mesa configuration.

6. The device of claim 1, wherein a plurality of photodiodes are arranged in a multiple array.

* * * * *